United States Patent
Lee

(10) Patent No.: US 7,241,963 B2
(45) Date of Patent: Jul. 10, 2007

(54) PLASMA DISPLAY APPARATUS INCLUDING ELECTRODE PAD

(75) Inventor: Yong Han Lee, Seoul (KR)

(73) Assignee: LG Electronics Inc, Seoul (KR)

(*) Notice: Subject to any disclaimer, the term of this patent is extended or adjusted under 35 U.S.C. 154(b) by 12 days.

(21) Appl. No.: 11/217,388

(22) Filed: Sep. 2, 2005

(65) Prior Publication Data
US 2006/0049151 A1    Mar. 9, 2006

(30) Foreign Application Priority Data
Sep. 3, 2004   (KR) .................... 10-2004-0070564

(51) Int. Cl.
*B23K 9/00*    (2006.01)
*B23K 9/02*    (2006.01)
(52) U.S. Cl. .................. 219/121.52; 313/484; 313/583
(58) Field of Classification Search .......... 219/121.52, 219/121.36, 121.51; 313/484, 491, 494, 313/585, 581–583, 586, 610; 315/169.1–169.4; 345/60, 62, 63, 66–69, 204, 208
See application file for complete search history.

(56) References Cited
U.S. PATENT DOCUMENTS

| | | | | |
|---|---|---|---|---|
| 3,964,050 A | * | 6/1976 | Mayer | ........................ 345/61 |
| 5,745,086 A | * | 4/1998 | Weber | ........................ 345/63 |
| 6,825,606 B2 | * | 11/2004 | Schermerhorn et al. | .... 313/484 |

* cited by examiner

*Primary Examiner*—Quang Van
(74) *Attorney, Agent, or Firm*—McKenna, Long & Aldridge

(57) ABSTRACT

A plasma display apparatus having an electrode pad including first and second electrode parts for connecting an electrode driving unit to the electrodes of the plasma display panel. The first electrode part includes a first electrode connection part and a first connector connection part connected by a first intermediate connection part, where the width of the first intermediate connection part is smaller than the width of the first electrode connection part and the width of the first connector connection part is greater than the first intermediate connection part. The second electrode part has a structure similar to the first electrode part, except the length of the first intermediate connection part is different from the length of the second intermediate connection part.

20 Claims, 5 Drawing Sheets

PLASMA DISPLAY APPARATUS INCLUDING ELECTRODE PAD

CROSS-REFERENCES TO RELATED APPLICATIONS

This Nonprovisional application claims priority under 35 U.S.C. § 119(a) on Patent Application No. 2004-0070564 filed in Korea on Sep. 3, 2004, the entire contents of which are hereby incorporated by reference,

BACKGROUND OF THE INVENTION

1. Field of the Invention

The present invention relates to a plasma display apparatus, and more particularly, to such a plasma display apparatus having an electrode pad.

2. Background of the Related Art

FIG. 1 is a dismantled perspective view of a common plasma display apparatus.

As shown in FIG. 1, the common plasma display apparatus includes an upper structure and a lower structure. The lower structure has a lower substrate 9 and an address electrode 2. The upper structure includes an upper substrate 1, a scan electrode 3, a sustain electrode 4, a dielectric layer 5 and a protection layer 6. The lower structure further includes barrier ribs 7 that support between-the upper substrate 1 and the lower substrate 2, and a phosphor layer 8 coated on a surface of he barrier ribs 7. An inert gas is injected into a space between the upper structure and the lower structure, forming a discharge region.

In the common plasma display apparatus constructed above, sufficient charges are generated in the entire discharge cells on a plasma display panel by applying a ramp-up pulse to the scan electrode 3 in a set-up period. Thereafter, in the common plasma display apparatus, a ramp-down pulse is applied to the scan electrode 3 in a set-down period, erasing a predetermined amount of charges. The charge distribution of the entire discharge cells becomes uniform.

In the common plasma display apparatus, an address pulse and a scan pulse are applied to the address electrodes 2 and the scan electrode 3, respectively, in an address period, thus selecting a cell to be turned on.

Thereafter, in the common plasma display apparatus, a sustain pulse is alternately applied to the scan electrode 3 and the sustain electrode 4 in a sustain period, so that a sustain discharge is generated in the cell selected in the address period.

For this operation, a driver IC of the common plasma display apparatus applies a driving pulse to 의 the address electrodes 2, the scan electrode 3 and the sustain electrode 4 of the plasma display panel through an electrode pad.

FIG. 2 is a plan view showing an electrode pad of a conventional plasma display apparatus.

As shown in FIG. 2, the electrode pad of the conventional plasma display apparatus includes a glass substrate 111, an electrode part 110 formed on the glass substrate 111, a white-back layer 112 disposed on one side of the electrode part 110, an Anisotropic Conductive Film (ACF) 113 disposed on the other end of the electrode part 110, and a connector 114 having a connector electrode 115 corresponding to the electrode part 110. At this time, the connector 114 applies a driving pulse, which is received from an electrode driving unit (not shown), to the electrode part.

In this case, the connector 114 is a COF (Chip On Film), a TCP (Tape Carrier Package) or a FPC (Flexible Printed Circuits), which becomes the cause for raising the manufacturing cost of the plasma display apparatus. Accordingly, in order to prevent the manufacturing cost from increasing due to the connector 114, the electrode pitch becomes minute. As the electrode pitch becomes minute, electrodes frequently become short due to a migration phenomenon. The migration phenomenon is a phenomenon that an ionized electrode material moves around.

More particularly, in the case of the conventional electrode pad, shortage is frequently generated at the interface between the ACF 113 for connecting the connector 114 and the electrode part 110 due to migration. Furthermore, since the width of the existing electrode part 110 is constant, there is a high possibility that the shortage due to migration can occur in the electrode part 110 exposed between the white-back layer 112 and the ACF 113 as the electrode pitch becomes minute. In addition, as the electrode pitch becomes minute, an align tolerance of the electrode part 110 and the connector electrode 115 is reduced. Thus, the defect probability is further increased. Further, as the pitch of the electrode part 110 becomes minute, the contact property between the electrode part 110 and the connector electrode 115 is lowered.

SUMMARY OF THE INVENTION

Accordingly, an object of the present invention is an electrode pad and a plasma display apparatus in which generation of shortage among electrodes due to migration can be prevented.

Another object of the present invention is an electrode pad and a plasma display apparatus in which an align tolerance can be secured.

Further another object of the present invention is an electrode pad and a plasma display apparatus, wherein the contact property with electrodes can be increased.

To achieve the above objects, according to the present invention, there is provided a plasma display apparatus, including a plasma display panel having electrodes, an electrode driving unit for driving the plasma display panel, and an electrode pad for connecting the electrode driving unit and the plasma display panel. In this case, the electrode pad includes a first electrode part including a first electrode connection part connected to the electrodes of the plasma display panel and having a first line width, a first intermediate connection part connected at one end to the first electrode connection part and having a second line width smaller than the first line width, and a first connector connection part connected at one end to the other end of the first intermediate connection part and having a third line width greater than the second line width, and a second electrode part, and a second electrode part including a second electrode connection part connected to the electrodes of the plasma display panel and having a fourth line width, a second intermediate connection part connected at one end to the second electrode connection part and having a fifth line width, which is smaller than or the same as the fourth line width, and a second connector connection part connected at one end to the other end of the second intermediate connection part and having a sixth line width greater than the fifth line width. Further, the first electrode part is disposed adjacent to the second electrode part, and the length of the first intermediate connection part and the length of the second intermediate connection part are different from each other.

According to the present invention, there is also provided an electrode pad including a first electrode part and a second electrode part. The first electrode part includes a first electrode connection part connected to the electrodes of the plasma display panel and having a first line width, a first intermediate connection part connected at one end to the first electrode connection part and having a second line width smaller than the first line width, and a first connector connection part connected at one end to the other end of the first intermediate connection part and having a third line width greater than the second line width. The second electrode part includes a second electrode connection part connected to the electrodes of the plasma display panel and having a fourth line width, a second intermediate connection part connected at one end to the second electrode connection part and having a fifth line width, which is smaller than or the same as the fourth line width, and a second connector connection part connected at one end to the other end of the second intermediate connection part and having a sixth line width greater than the fifth line width. The first electrode part is disposed adjacent to the second electrode part, and the length of the first intermediate connection part and the length of the second intermediate connection part are different from each other.

As described above, according to the present invention, the line width of an intermediate connection part is made narrow and the width of a connector connection part is made wide. An align tolerance can be secured.

According to the present invention, the line width of an intermediate connection part is made narrow and the width of a connector connection part is made wide. Shortage due to migration can be prevented.

According to the present invention, the width of a connector connection part is made wide. Contactability with a connector electrode can be improved.

According to the present invention, the line width of an intermediate connection part is made narrow and the width of a connector connection part is made wide. A pitch between electrode parts can be further reduced.

BRIEF DESCRIPTION OF THE DRAWINGS

Further objects and advantages of the invention can be more fully understood from the following detailed description taken in conjunction with the accompanying drawings in which.

DETAILED DESCRIPTION OF THE PREFERRED EMBODIMENT

The present invention will now be described in detail in connection with preferred embodiments with reference to the accompanying drawings.

Figure 1:
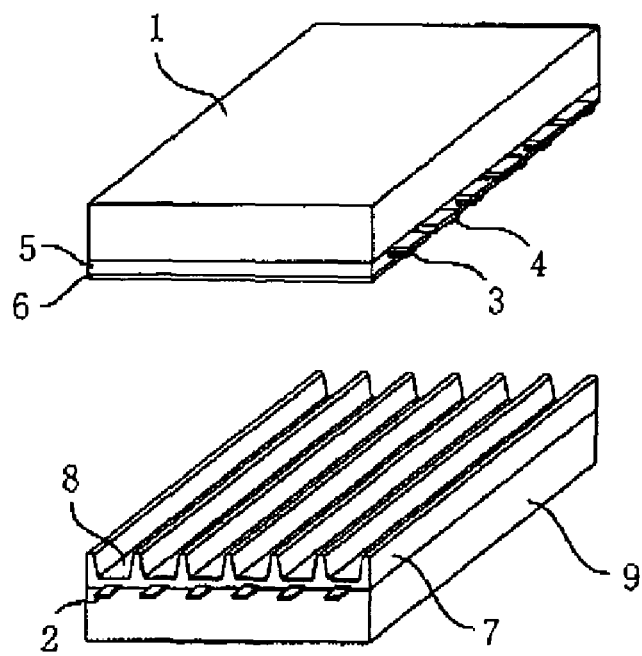
FIG. 1 is a dismantled perspective view of a common plasma display apparatus.
Figure 2:
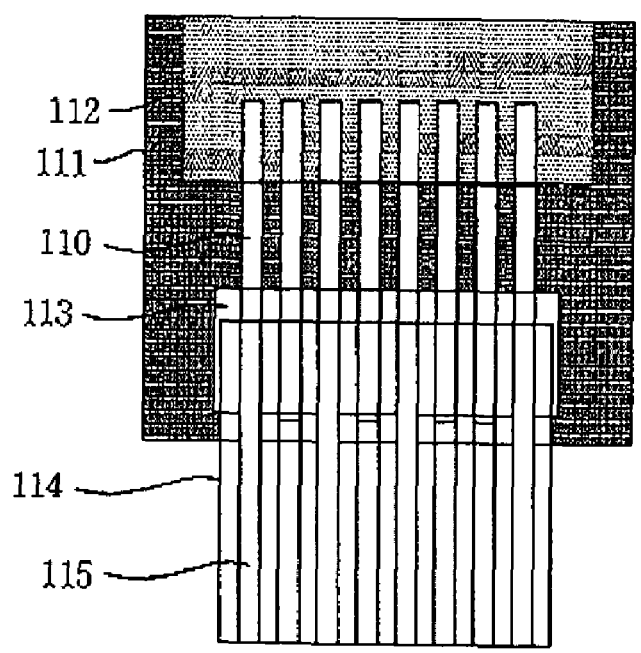
FIG. 2 is a plan view showing an electrode pad of a conventional plasma display apparatus.
Figure 3:
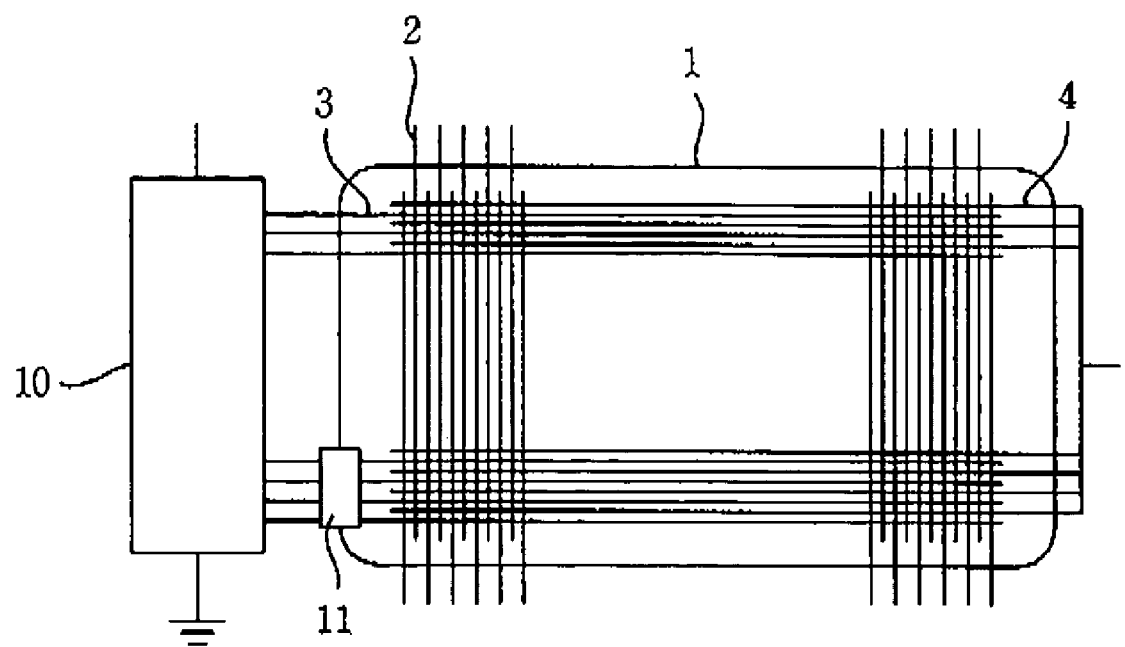
FIG. 3 shows a plasma display apparatus having an electrode pad according to the present invention.

FIG. 3 shows a plasma display apparatus having an electrode pad according to the present invention.

As shown in FIG. 3, the plasma display apparatus having the electrode pad according to the present invention includes a plasma display panel 1 having electrodes, an electrode driving unit 10 for driving the plasma display panel 1, and an electrode pad 11 for connecting the electrode driving unit 10 and the plasma display panel 1. At this time, the electrode pad 11 will be described in detail in connection with the following embodiments.

Embodiment 1

Figure 4:
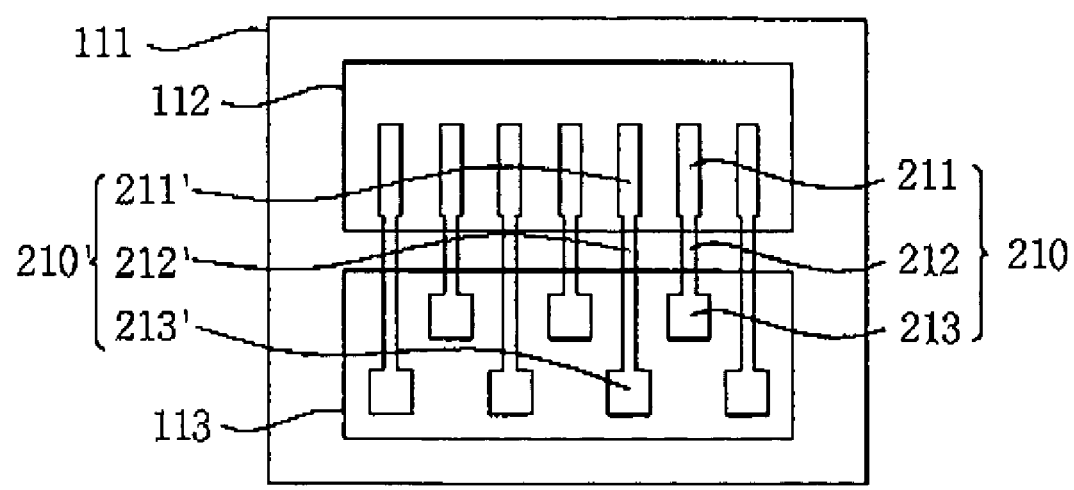
FIG. 4 is a plan view showing an electrode pad of a plasma display apparatus according to a first embodiment of the present invention.

FIG. 4 is a plan view showing an electrode pad of a plasma display apparatus according to a first embodiment of the present invention. As shown in FIG. 4, the electrode pad of the plasma display apparatus according to a first embodiment of the present invention includes a first electrode part 210 and a second electrode part 210'.

The first electrode part 210 includes a first electrode connection part 211, which are connected to the electrodes of the plasma display panel and have a first line width, a first intermediate connection part 212 connected at one end to the first electrode connection part 211 and having a second line width smaller than the first line width, and a first connector connection part 213 connected at one end to the other end of the first intermediate connection part 212 and having a third line width greater than the second line width.

The second electrode part 210' includes a second electrode connection part 211' connected to the electrodes of the plasma display panel and having a fourth line width, a second intermediate connection part 212' connected at one end to the second electrode connection part 211' and having a fifth line width, which is smaller than or the same as the fourth line width, and a second connector connection part 213' connected at one end to the other end of the second intermediate connection part 212' and having a sixth line width greater than the fifth line width.

In this case, the first electrode part 210 is disposed adjacent to the second electrode part 210'. The length of the first intermediate connection part 212 and the length of the second intermediate connection part 212' are different from each other.

The first embodiment of the present invention shown in FIG. 4 shows a case where the length of the first intermediate connection part 212 is shorter than that of the second intermediate connection part 212', and the line width of the second intermediate connection part 212' of the second electrode part 210' is smaller than the fourth line width, The third line width of the first connector connection part 213 can be greater than the first line width, and the sixth line width of the second connector connection part 213' can be greater than the fourth line width.

The first electrode part 210 and the second electrode part 210' are formed on the glass substrate 111. The first electrode connection part 211 and the second electrode connection part 211' are covered with the white-back layer 112. Further, the first connector connection part 213 and the second connector connection part 213' are covered with the ACF 113. Some of the first intermediate connection part 212 and the second intermediate connection part 212' are exposed in a region between the white-back layer 112 and the ACF 113.

Figure 5:
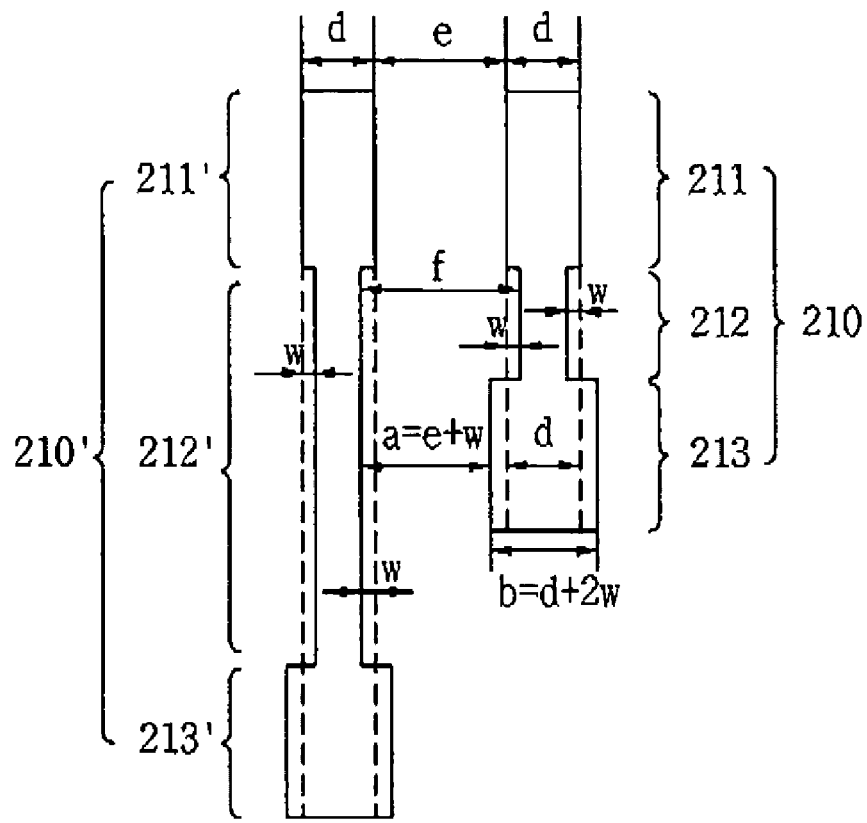
FIG. 5 is a detailed plan view showing the electrode pad of the plasma display apparatus according to a first embodiment of the present invention.

FIG. 5 is a detailed plan view showing the electrode pad of the plasma display apparatus according to a first embodiment of the present invention, As shown in FIG. 5, if the second line width of a first intermediate connection part 212 is smaller than the first line width of a first electrode connection part 211 as much as 2w, the line width (b) of the first connector connection part 213 can be made greater than the line width (d) of the first electrode connection part 211.

For example, if the line width (b) of the first connector connection part 213 becomes (d+2w), a distance (a) between the first connector connection part 213 and the second intermediate connection part 212' becomes "e+w". Therefore, the line width (b) of the first connector connection part 213 is greater than the electrode line width (d) of the conventional electrode pad, and the distance (a) between the first connector connection part 213 and the second intermediate connection part 212' is greater than the distance (e) between electrodes of the conventional electrode pad. An align tolerance can be secured accordingly. At this time, when the distance (a) between the first connector connection part 213 and the second intermediate connection part 212' and the line width (b) of the first connector connection part 213 are the same, a maximum align tolerance can be secured.

Furthermore, the distance (f) between the first intermediate connection part 212 and the second intermediate connection part 212' is greater than the distance (e) between the electrodes of the conventional electrode pad. Shortage incurred by migration can be prevented accordingly.

Furthermore, since the line width (b) of the first connector connection part 213 is greater than the electrode line width (d) of the conventional electrode pad, contactability with the connector electrode can be improved.

In addition, the electrode pad of the present invention can reduce the pitch between the electrodes. That is, the present invention can secure an align tolerance, prevent shortage due to migration and further reduce the pitch between electrodes.

At this time, the line widths of the first connector connection parts can be different. A difference in the line width between the first connector connection parts can be set from 5 μm to 100 μm. Furthermore, the line widths of the second connector connection parts can be different. A difference in the line width between the second connector connection parts can be set from 5 μm to 100 μm.

Embodiment 2

Figure 6:
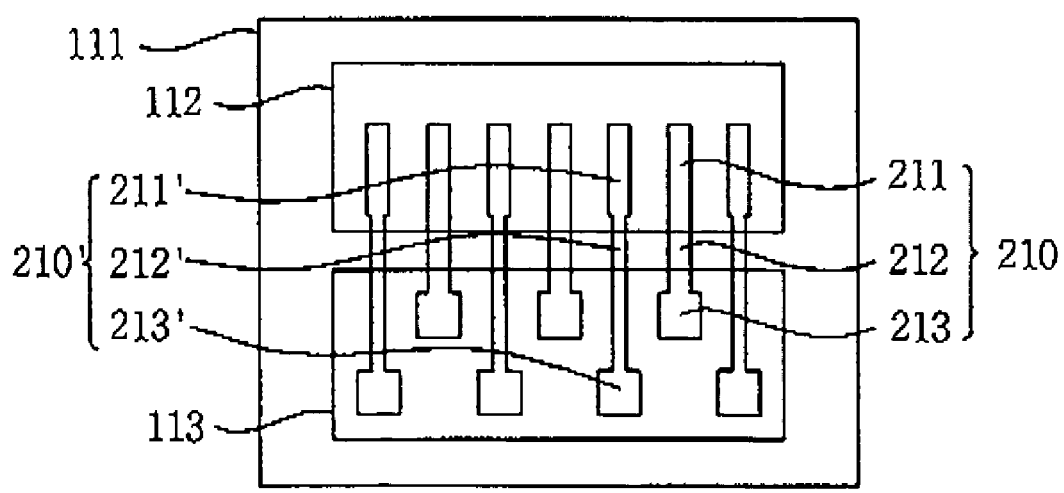
FIG. 6 is a plan view showing an electrode pad of a plasma display apparatus according to a second embodiment of the present invention.

FIG. 6 is a plan view showing an electrode pad of a plasma display apparatus according to a second embodiment of the present invention. As shown in FIG. 6, the second embodiment of the present invention shows a case where the fifth line width of a second intermediate connection part 212' of the second electrode part 210' is the same as the fourth line width of the second electrode connection part 211'.

In the same manner as the first embodiment, the first connector connection part 213 and the second connector connection part 213' can have a third line width and a sixth line width, respectively, which are greater than the first line width and the fourth line width.

The first electrode part 210 and the second electrode part 210' are formed on the glass substrate 111. The first electrode connection part 211 and the second electrode connection part 211' are covered with the white-back layer 112. Furthermore, the first connector connection part 213 and the second connector connection part 213' are covered with the ACF 113. Some of the first intermediate connection part 212 and the second intermediate connection part 212' are exposed in a region between the white-back layer 112 and the ACF 113.

The distance between the first intermediate connection part 212 and the second intermediate connection part 212' in the second embodiment is smaller than the distance (f) between the first intermediate connection part 212 and the second intermediate connection part 212' in the first embodiment, but is greater than the distance (e) between the electrodes of the conventional electrode pad. It is thus possible to prevent shortage incurred by migration.

The distance between the first connector connection part 213 and the second intermediate connection part 212' in the second embodiment is the same as the distance (a) between the first connector connection part 213 and the second intermediate connection part 212' in the first embodiment. An align tolerance can be secured accordingly.

Furthermore, since the line width of the first connector connection part 213 is greater than the electrode line width (d) of the conventional electrode pad shown in FIG. 5, contactability with the connector electrode can be enhanced.

In this case, the line width of the first connector connection parts can be different. A difference in the line width between the first connector connection parts can be set from 5 μm to 100 μm. In addition, the line widths of the second connector connection parts can be different. A difference in the line width between the second connector connection parts can be set from 5 μm to 100 μm.

Embodiment 3

Figure 7:
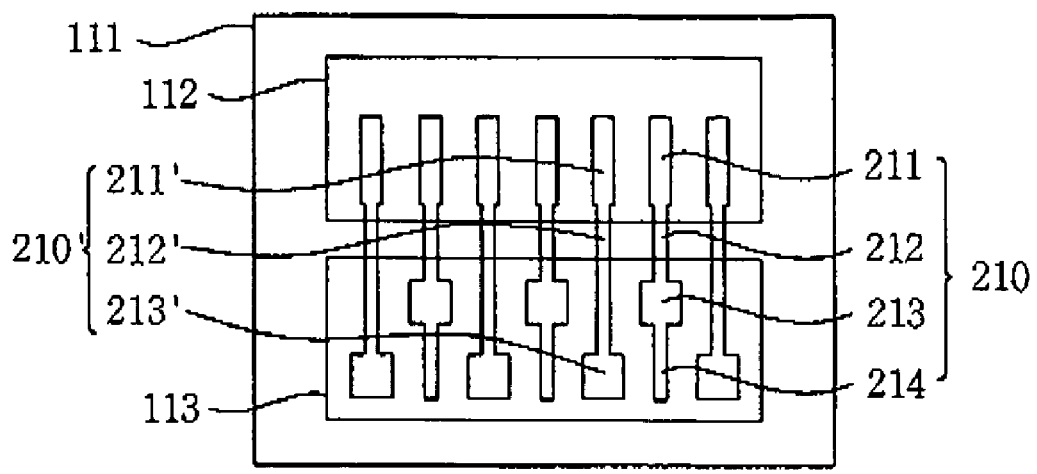
FIG. 7 is a plan view showing an electrode pad of a plasma display apparatus according to a third embodiment of the present invention.

FIG. 7 is a plan view showing an electrode pad of a plasma display apparatus according to a third embodiment of the present invention.

As shown in FIG. 7, when the line width of the second intermediate connection part 212' is greater than the fourth line width and the length of the second intermediate connection part 212' is longer than that of the first intermediate connection part 212, the first electrode part 210 of the third embodiment includes an assistant connection part 214 connected to the first connector connection part 213 and having a line width smaller than the third line width of the first connector connection part 213. At this time, the length of the first electrode part 210 having the assistant connection part 214 can be the same as that of the second electrode part 210'.

The third embodiment of the present invention can not only provide the effects obtained by the first embodiment of the present invention, but also further improve contactability with the connector electrode.

In the same manner as the first embodiment, the first connector connection part 213 and the second connector connection part 213' can have the third line width and the sixth line width, respectively, which are greater than the first line width and the fourth line width.

The first electrode part 210 and the second electrode part 210' are formed on the glass substrate 111. The first electrode connection part 211 and the second electrode connection part 211' are covered with the white-back layer 112. Furthermore, the first connector connection part 213 and the second connector connection part 213' including the assistant connection part 214 are covered with the ACF 113. Some of the first intermediate connection part 212 and the second intermediate connection part 212' are exposed in a region between the white-back layer 112 and the ACF 113.

In this case, the line width of the first connector connection parts can be different. A difference in the line width between the first connector connection parts can be set from 5 µm to 100 µm. In addition, the line widths of the second connector connection parts can be different. A difference in the line width between the second connector connection parts can be set from 5 µm to 100 µm.

Embodiment 4

Figure 8:
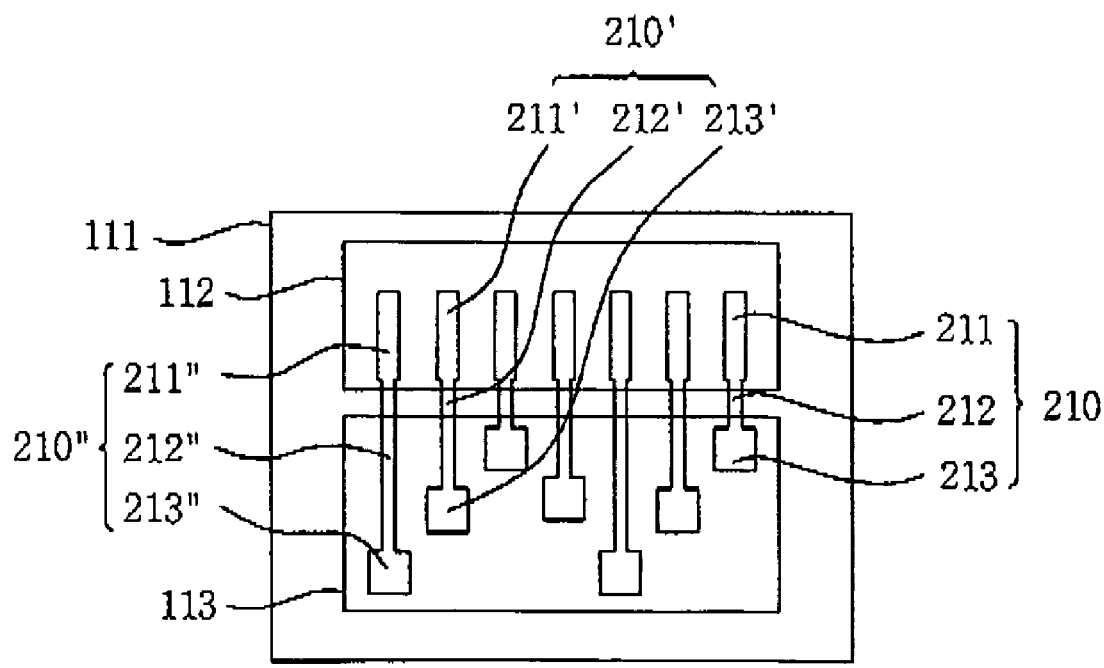
FIG. 8 is a plan view showing an electrode pad of a plasma display apparatus according to a fourth embodiment of the present invention.

FIG. 8 is a plan view showing an electrode pad of a plasma display apparatus according to a fourth embodiment of the present invention.

As shown in FIG. 8, when the line width of the second intermediate connection part 212' is greater than the fourth line width and the length of the second intermediate connection part 212' is longer than that of the first intermediate connection part 212, the fourth embodiment of the present invention further includes a third electrode part 210" having a third electrode connection part connected to the electrodes of the plasma display panel and having a seventh line width, a third intermediate connection part connected at one end to the third electrode connection part and having an eighth line width smaller than the seventh line width, and a third connector connection part connected at one end to the other end of the third intermediate connection part and having a ninth line width greater than the eighth line width.

At this time, the third electrode part 210" is disposed adjacent to the second electrode part 210'. The length of the third intermediate connection part 212" is greater than that of the second intermediate connection part 212'.

The first electrode part 210, the second electrode part 210' and the third electrode part 210" are formed on the glass substrate 111. The first electrode connection part 211, the second electrode connection part 211' and the third electrode connection part 211" are covered with the white-back layer 112. Furthermore, the first connector connection part 213, the second connector connection part 213' and the third connector connection part 213" are covered with the ACF 113. Some of the first intermediate connection part 212, the second intermediate connection part 212' and the third intermediate connection part 212" are exposed in a region between the white-back layer 112 and the ACF 113.

In this case, the line width of the first connector connection parts can be different. A difference in the line width between the first connector connection parts can be set from 5 µm to 100 µm. In addition, the line widths of the second connector connection parts can be different A difference in the line width between the second connector connection parts can be set from 5 µm to 100 µm. Furthermore, the line width of the third connector connection parts can be different. A difference in the line width between the third connector connection parts can be set from 5 µm to 100 µm.

The fourth embodiment of the present invention can not only provide the effects obtained by the first embodiment of the present invention, but also diversify the length of the intermediate connection part and the location of the connector connection part.

Figure 9:
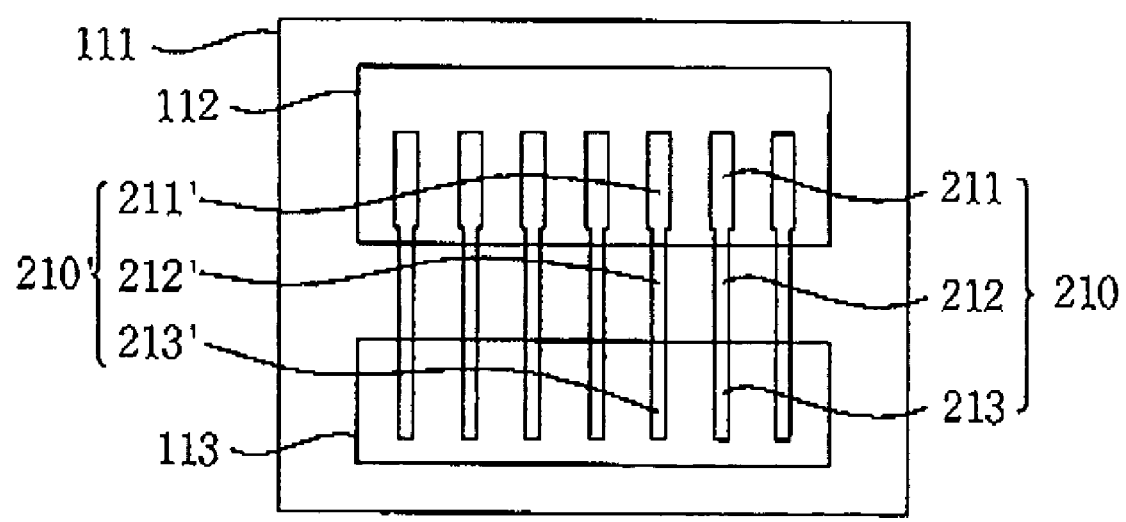
FIG. 9 is a plan view showing an electrode pad of a plasma display apparatus according to a fifth embodiment of the present invention.

FIG. 9 is a plan view showing an electrode pad of a plasma display apparatus according to a fifth embodiment of the present invention. As shown in FIG. 9, in the electrode pad according to a fifth embodiment of the present invention, the third line width of the first connector connection part 213 is the same as the second line width of the first intermediate connection part 212, and the sixth line width of the second connector connection part 213' is the same as the fifth line width of the second intermediate connection part 212'. At this time, the lengths of the first electrode part 210 and the second electrode part 210' are the same.

The first electrode part 210 and the second electrode part 210' are formed on the glass substrate 111. The first electrode connection part 211 and the second electrode connection part 211' are covered with the white-back layer 112. Furthermore, the first connector connection part 213 and the second connector connection part 213' are covered with the ACF 113. Some of the first intermediate connection part 212 and the second intermediate connection part 212' are exposed in a region between the white-back layer 112 and the ACF 113.

The electrode pad according to the fifth embodiment of the present invention can prevent shortage between the electrode parts due to migration.

As described above, according to the present invention, the line width of an intermediate connection part is made narrow and the width of a connector connection part is made wide. An align tolerance can be secured.

According to the present invention, the line width of an intermediate connection part is made narrow and the width of a connector connection part is made wide. Shortage due to migration can be prevented.

According to the present invention, the width of a connector connection part is made wide. Contactability with a connector electrode can be improved.

According to the present invention, the line width of an intermediate connection part is made narrow and the width of a connector connection part is made wide. A pitch between electrode parts can be further reduced.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A plasma display apparatus, comprising:
   a plasma display panel having electrodes;
   an electrode driving unit for driving the plasma display panel; and
   an electrode pad for connecting the electrode driving unit and the plasma display panel, wherein the electrode pad comprises:
   a first electrode part including a first electrode connection part connected to the electrodes of the plasma display panel and having a first line width, a first intermediate connection part connected at one end to the first electrode connection part and having a second line width smaller than the first line width, and a first connector connection part connected at one end to the other end of the first intermediate connection part and having a third line width greater than the second line width, and
   a second electrode part including a second electrode connection part connected to the electrodes of the plasma display panel and having a fourth line width, a second intermediate connection part connected at one end to the second electrode connection part and having a fifth line width, which is smaller than or the same as the fourth line width, and a second connector connection part connected at one end to the other end of the second intermediate connection part and having a sixth line width greater than the fifth line width,
   wherein the first electrode part is disposed adjacent to the second electrode part, and the length of the first intermediate connection part and the lengths of the second intermediate connection part are different from each other.

2. The plasma display apparatus as claimed in claim 1, wherein the first electrode connection part and the second electrode connection part are covered with a white-back layer, and the first connector connection part and the second connector connection part are covered with an Anisotropic Conductive Film.

3. The plasma display apparatus as claimed in claim 2, wherein the first intermediate connection part and the second intermediate connection part are exposed in a region between the white-back layer and the Anisotropic Conductive Film.

4. The plasma display apparatus as claimed in claim 1, wherein the length of the first intermediate connection part is shorter than that of the second intermediate connection part, and the fifth line width of the second intermediate connection part is smaller than the fourth line width.

5. The plasma display apparatus as claimed in claim 4, wherein a distance between the first connector connection part and the second intermediate connection part and the third line width of the first connector connection part are the same.

6. The plasma display apparatus as claimed in claim 1, wherein the third line width of the first connector connection part is greater than the first line width of the first connector connection part, and the sixth line width of the second connector connection part is greater than the fourth line width of the second electrode connection part.

7. The plasma display apparatus as claimed in claim 1, wherein the electrode pad includes a plurality of first electrode parts and a plurality of second electrode parts, the line width of the first connector connection part included in the first electrode part of one or more of the plurality of first electrode parts has a first difference from the line width of the first connector connection part included in the remaining first electrode parts, wherein the first difference is from 5 pm to 100 tan, and the line width of the second connector connection part included in the second electrode part of one or more of the plurality of second electrode parts has a second difference from the line width of the second connector connection part included in the remaining second electrode parts, wherein the second difference is from 5 um to 100 pm.

8. The plasma display apparatus as claimed in claim 1, wherein the third line width of the first connector connection part is greater than the first line width of the first connector connection part, and the sixth line width of the second connector connection part is greater than the fourth line width of the second electrode connection part, and the fifth line width of the second intermediate connection part is the same as the fourth line width of the second electrode connection part.

9. The plasma display apparatus as claimed in claim 1, wherein the third line width of the first connector connection part is greater than the first line width of the first connector connection part, the sixth line width of the second connector connection part is greater than the fourth line width of the second electrode connection part, the fifth line width of the second intermediate connection part is smaller than the fourth line width of the second electrode connection part, and the length of the second intermediate connection part is greater than the length of the first intermediate connection part, and the first electrode part further includes an assistant connection part connected to the first connector connection part and having a line width smaller than the third line width of the first connector connection part.

10. The plasma display apparatus as claimed in claim 9, wherein the length of the first electrode part including the assistant connection part is the same as the length of the second electrode part.

11. The plasma display apparatus as claimed in claim 9, wherein the third line width of the first connector connection part is greater than the first line width of the first connector connection part, the sixth line width of the second connector connection part is greater than the fourth line width of the second electrode connection part, the line width of the second intermediate connection part is smaller than the fourth line width of the second electrode connection part, and the length of the second intermediate connection part is greater than the length of the first intermediate connection part, the electrode pad further includes a third electrode part having a third electrode connection part connected to the electrodes of the plasma display panel and having a seventh line width, a third intermediate connection part connected at one end to the third electrode connection part and having an eighth line width smaller than the seventh line width, and a third connector connection part connected at one end to the other end of the third intermediate connection part and having a ninth line width greater than the eighth line width, and the third electrode part is disposed adjacent to the second electrode part, and the length of the third intermediate connection part is greater than that of the second intermediate connection part.

12. An electrode pad comprises:

a first electrode part including a first electrode connection part connected to the electrodes of the plasma display panel and having a first line width, a first intermediate connection part connected at one end to the first electrode connection part and having a second line width smaller than the first line width, and a first connector connection part connected at one end to the other end of the first intermediate connection part and having a third line width greater than the second line width; and a second electrode part including a second electrode connection part connected to the electrodes of the plasma display panel and having a fourth line width, a second intermediate connection part connected at one end to the second electrode connection part and having a fifth line width, which is smaller than or the same as the fourth line width, and a second connector connection part connected at one end to the other end of the second intermediate connection part and having a sixth line width greater than the fifth line width, wherein the first electrode part is disposed adjacent to the second electrode part, and the length of the first intermediate connection part and the lengths of the second intermediate connection part are different from each other.

13. The electrode pad as claimed in claim 12, wherein the first electrode connection part and the second electrode connection part are covered with a white-back layer, the first connector connection part and the second connector connection part are covered with an Anisotropic Conductive Film, and the first intermediate connection part and the second intermediate connection part are exposed in a region between the white-back layer and the Anisotropic Conductive Film.

14. The electrode pad as claimed in claim 12, wherein the length of the first intermediate connection part is shorter than that of the second intermediate connection part, and the fifth line width of the second intermediate connection part is smaller than the fourth line width.

15. The electrode pad as claimed in claim 14, wherein a distance between the first connector connection part and the second intermediate connection part and the third line width of the first connector connection part are the same.

16. The electrode pad as claimed in claim 12, wherein the third line width of the first connector connection part is greater than the first line width of the first connector connection part, and the sixth line width of the second connector connection part is greater than the fourth line width of the second electrode connection part.

17. The electrode pad as claimed in claim 12, wherein the third line width of the first connector connection part is greater than the first line width of the first connector connection part, and the sixth line width of the second connector connection part is greater than the fourth line width of the second electrode connection part, and
    the fifth line width of the second intermediate connection part is the same as the fourth line width of the second electrode connection part.

18. The electrode pad as claimed in claim 12, wherein the third line width of the first connector connection part is greater than the first line width of the first connector connection part, the sixth line width of the second connector connection part is greater than the fourth line width of the second electrode connection part, the fifth line width of the second intermediate connection part is smaller than the fourth line width of the second electrode connection part, and the length of the second intermediate connection part is greater than the length of the first intermediate connection part, and the first electrode part further includes an assistant connection part connected to the first connector connection part and having a line width smaller than the third line width of the first connector connection part.

19. The electrode pad as claimed in claim 18, wherein the length of the first electrode part including the assistant connection part is the same as the length of the second electrode part.

20. The electrode pad as claimed in claim 12, wherein the third line width of the first connector connection part is greater than the first line width of the first connector connection part, the sixth line width of the second connector connection part is greater than the fourth line width of the second electrode connection part, the line width of the second intermediate connection part is smaller than the fourth line width of the second electrode connection part, and the length of the second intermediate connection part is greater than the length of the first intermediate connection part,
    the electrode pad further includes a third electrode part having a third electrode connection part connected to the electrodes of the plasma display panel and having a seventh line width, a third intermediate connection part connected at one end to the third electrode connection part and having an eighth line width smaller than the seventh line width, and a third connector connection part connected at one end to the other end of the third intermediate connection part and having a ninth line width greater than the eighth line width, and
    the third electrode part is disposed adjacent to the second electrode part, and the length of the third intermediate connection part is greater than that of the second intermediate connection part.

* * * * *